(12) United States Patent
Jung et al.

(10) Patent No.: US 8,299,465 B2
(45) Date of Patent: Oct. 30, 2012

(54) X-RAY DETECTOR

(75) Inventors: Kwan-Wook Jung, Yongin (KR); Dong-Hyuk Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 174 days.

(21) Appl. No.: 12/972,393

(22) Filed: Dec. 17, 2010

(65) Prior Publication Data

US 2011/0147741 A1    Jun. 23, 2011

(30) Foreign Application Priority Data

Dec. 18, 2009  (KR) .................. 10-2009-0127307

(51) Int. Cl.
*H01L 31/119*   (2006.01)
(52) U.S. Cl. ............... 257/53; 257/59; 257/E31.091
(58) Field of Classification Search ............ 257/53, 257/59, 370.11, E31.091, E21.001; 438/64
See application file for complete search history.

(56) References Cited

U.S. PATENT DOCUMENTS

| | | | |
|---|---|---|---|
| 2009/0026383 A1* | 1/2009 | Kim et al. ............... | 250/370.11 |
| 2009/0108209 A1 | 4/2009 | Jung et al. | |
| 2010/0051819 A1 | 3/2010 | Jung et al. | |
| 2010/0200859 A1* | 8/2010 | Joo et al. ................. | 257/59 |

FOREIGN PATENT DOCUMENTS

| | | |
|---|---|---|
| JP | 2009-059975 | 3/2009 |
| KR | 10-2002-0011035 A | 2/2002 |
| KR | 10-2003-0017875 A | 3/2003 |
| KR | 10-2008-0102488 | 11/2008 |
| KR | 10-2008-0108642 | 12/2008 |
| KR | 10-2009-0087278 | 8/2009 |

* cited by examiner

*Primary Examiner* — Benjamin Sandvik
*Assistant Examiner* — Whitney T Moore
(74) *Attorney, Agent, or Firm* — Robert E. Bushnell, Esq.

(57) ABSTRACT

An X-ray detector constructed as an exemplary embodiment of the present invention includes a semiconductor layer, a data line including a source electrode covering a first portion of the semiconductor layer, a drain electrode disposed opposite to the source electrode, a first lower electrode formed on the upper portion of a second portion of the semiconductor layer and a gate insulating layer and elongated from the drain electrode, and a passivation layer formed on the upper portion of one part of the lower electrode including the drain electrode. Further, the second lower electrode is formed approaching the gate electrode. The X-ray detector constructed as the exemplary embodiment of the present invention includes a second lower electrode formed on the passivation layer and placed approaching a gate electrode. The area in which a diode is disposed may be maximized, and the amount of leakage current may be reduced.

18 Claims, 7 Drawing Sheets

FIG. 7

X-RAY DETECTOR

CLAIM OF PRIORITY

This application makes reference to, incorporates the same herein, and claims all benefits accruing under 35 U.S.C. §119 from an application earlier filed in the Korean Intellectual Property Office on 18 Dec. 2009 and there duly assigned Serial No. 10-2009-0127307.

BACKGROUND OF THE INVENTION

1. Field of the Invention

The present invention relates to an X-ray detector and, more particularly, to an X-ray detector including a thin film transistor and a PIN (P type-Intrinsic-N type) diode.

2. Description of the Related Art

Recently, a radiation transparent photograph apparatus for the medical industry has been in the spotlight as a high-value-added industry. An X-ray detector is one of the radiation transparent photograph apparatuses, and the detective quantum efficiency (DQE) is one of important parameters to determine the performance of the X-ray detector.

The above information disclosed in this Background section is only for enhancement of understanding of the background of the invention and therefore it may contain information that does not form the prior art that is already known in this country to a person of ordinary skill in the art.

SUMMARY OF THE INVENTION

It is therefore for the present invention to provide an improved X-ray detector having a high DQE.

In an exemplary embodiment of the present invention, an X-ray detector may include a first substrate; a gate electrode formed on the substrate; a gate insulating layer formed on the gate electrode and the first substrate and formed to cover the gate electrode; a semiconductor layer, of a thin film transistor stacked on one part of the gate insulating layer; a data line configured to include a source electrode to cover a first portion of the semiconductor layer; a first lower electrode configured to include a drain electrode opposite to the source electrode, formed on the upper portion of the gate insulating layer and a second portion of the semiconductor layer, and elongated from the drain electrode; a passivation layer formed on the upper portion of one part of the first lower electrode; a second lower electrode formed on the upper portion of the passivation layer and on the upper portion of the first lower electrode in which the passivation layer is not formed; a semiconductor layer of a diode formed on the upper portion of the second lower electrode; and an upper electrode formed on the upper portion of the semiconductor layer for the diode. The second lower electrode is formed approaching the gate electrode and is formed to not overlap with the gate electrode.

The passivation layer is formed on the upper portion of the drain electrode and one part of the first lower electrode connected to the drain electrode. The passivation layer is formed on the upper portion of the second lower electrode so that the passivation layer is stacked approaching the gate electrode. The X-ray detector further includes a protective layer formed on the upper portion of the upper electrode. The X-ray detector further includes a scintillator layer for converting an externally incident X-ray into a visible ray.

In another exemplary embodiment of the present invention, an X-ray detector may include a first substrate; a gate electrode formed on the substrate; a gate insulating layer formed on the gate electrode and the first substrate and formed to cover the gate electrode; a semiconductor layer of a thin film transistor stacked on one part of the gate insulating layer; a data line configured to include a source electrode to cover a first portion of the semiconductor layer; a first lower electrode configured to include a drain electrode opposite to the source electrode, formed on the upper portion of the gate insulating layer and a second portion of the semiconductor layer, and elongated from the drain electrode; a passivation layer formed on the upper portion of one part of the first lower electrode; a second lower electrode formed on the upper portion of the passivation layer and on the upper portion of the first lower electrode in which the passivation layer is not formed; a semiconductor layer of a diode formed on the upper portion of the second lower electrode; and an upper electrode formed on the upper portion of the semiconductor layer for the diode. The second lower electrode overlaps with the gate electrode. The first lower electrode and the semiconductor layer for the diode overlap with the gate electrode.

The passivation layer is formed on the upper portion of the drain electrode and one part of the first lower electrode connected to the drain electrode. The passivation layer is formed on the upper portion of the second lower electrode so that the passivation layer is overlapped with the gate electrode and stacked on the gate electrode. The X-ray detector further includes a protective layer formed on the upper portion of the upper electrode. The X-ray detector further includes a scintillator layer for converting an externally incident X-ray into a visible ray.

The X-ray detector constructed as the exemplary embodiments of the present invention can maximize the area in which a PIN diode used as a photosensor is disposed within the X-ray detector. Further, in forming the PIN diode, the passivation layer is formed, and the second lower electrode is formed on the upper portion of the passivation layer. Accordingly, the amount of leakage current of the PIN diode can be reduced. Accordingly, the DQE of the X-ray detection can be increased.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Hereinafter, exemplary embodiments of the present invention will be described with reference to the accompanying drawings in order for those having ordinary skill in the art to be able to easily implement them. The present invention can be implemented in various forms, and is not limited to the following exemplary embodiments.

Further, in several exemplary embodiments, constituent elements having the same construction are assigned the same reference numerals and are representatively described in connection with a first exemplary embodiment. In the remaining exemplary embodiments, only constituent different elements from those of the first exemplary embodiment are described To clarify the description of the present invention, parts not related to the description are omitted, and the same reference numbers will be used throughout the drawings to refer to the same or like parts.

Throughout this specification and the claims that follow, when it is described that an element is "coupled" to another element, the element may be "directly coupled" to the other element or "electrically coupled" to the other element through a third element. Furthermore, when it is said that any part "includes" any constituent elements, it means the part may further include other constituent elements unless otherwise described without excluding other constituent elements.

The operation of an X-ray detector is now described. First, an X-ray is emitted from an X-ray source. When the emitted X-ray passes through a subject for photography, a scintillator included in the X-ray detector converts X-ray light that has passed through the subject into a visible ray in dependence upon the density of the subject. A photosensor included in the X-ray detector receives the converted visible ray and detects the amount of electrical charges generated in response to the conversion. The amount of electrical charges detected is converted into digital signals and is then represented in the form of a digital image.

One of the major indices to indicate the performance of an X-ray detector may include detective quantum efficiency (DQE). That is, the performance of an X-ray detector may be determined in dependence upon how quanta can be finely detected under the same photographing conditions.

The DQE varies depending on the model or specification of the X-ray detector. In particular, the DQE depends on the performance of a photosensor provided on the panel of the X-ray detector.

In order to improve the performance of the X-ray detector, the DQE must be increased. In order to improve the DQE, the performance of the photosensor must be improved.

The above information disclosed is only for enhancement of understanding of the background of the invention and therefore it may contain information that does not form the prior art that is already known in this country to a person of ordinary skill in the art.

Figure 1:
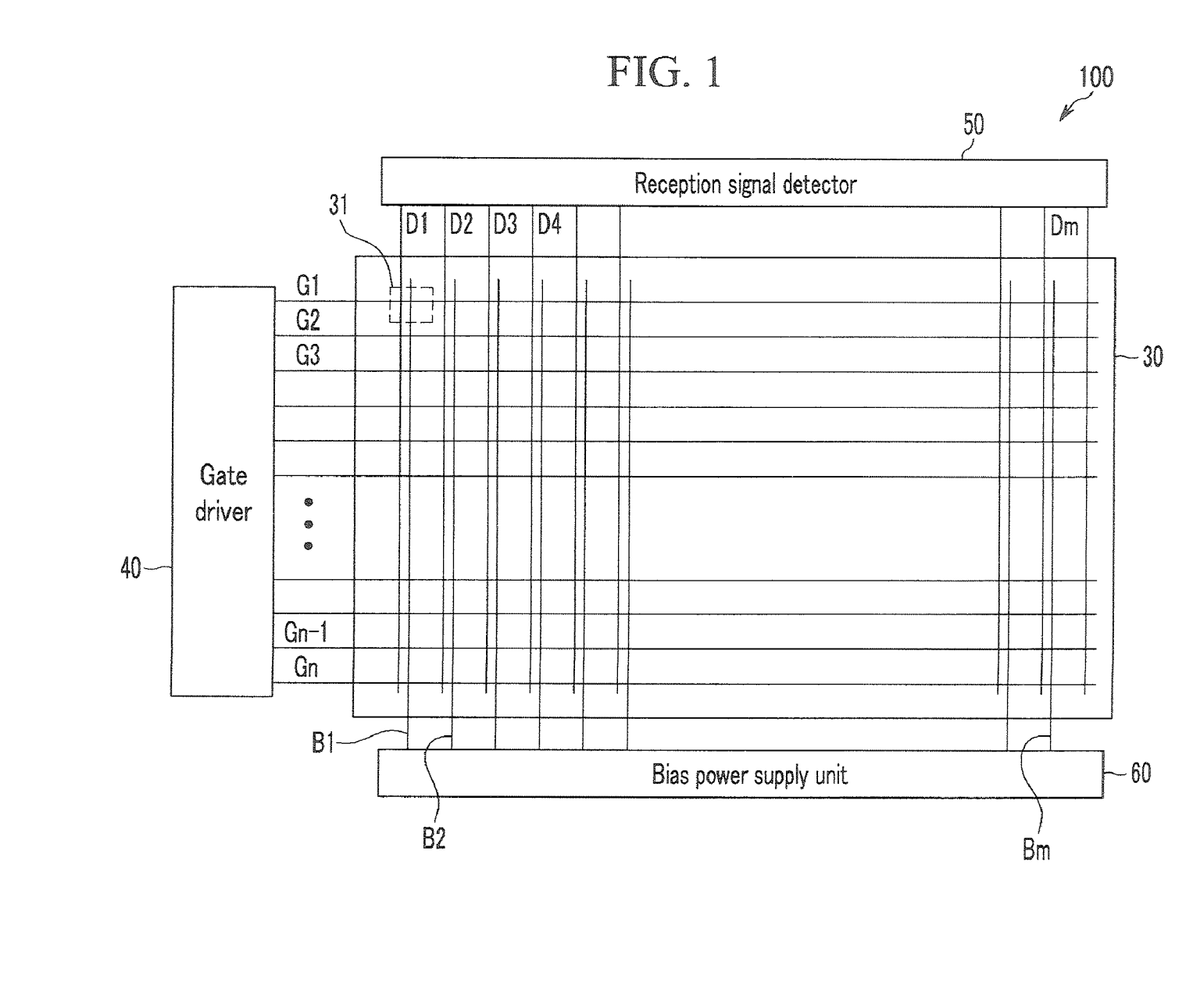
FIG. 1 is a block diagram showing the construction of an X-ray detector constructed as an exemplary embodiment of the present invention.

FIG. 1 is a block diagram showing the construction of an X-ray detector constructed as an exemplary embodiment of the present invention.

Referring to FIG. 1, an X-ray detector 100 constructed as the exemplary embodiment of the present invention includes an X-ray detection panel 30, a gate driver 40, a reception signal detector 50, and a bias power supply unit 60.

The X-ray detection panel 30 includes a plurality of signal lines G1-Gn, D1-Dm, and B1-Bm, and a plurality of detection unit elements (e.g., 31) connected to the signal lines and arranged approximately in a matrix form.

Each of the detection unit elements 31 includes one thin film transistor and one photosensor. A PIN diode may be used as the photosensor. A PiN diode is a diode with a wide, lightly doped intrinsic semiconductor region disposed between p-type semiconductor and n-type semiconductor regions. The p-type and n-type regions are typically heavily doped because they are used for ohmic contacts. Hereinafter, an example in which the PIN diode is used as the photosensor is described. The detection unit element 31 is described in detail below with reference to FIGS. 2 through 7.

The signal lines G1-Gn, D1-Dm, and B1-Bm include a plurality of the gate lines G1-Gn for transferring gate signals (also referred to as scan signals), a plurality of the data lines D1-Dm for transferring signals that are detected by the respective PIN diodes to the reception signal detector 50, and a plurality of bias lines B1-Bm for supplying bias voltages to the respective PIN diodes. The gate lines G1-Gn extend approximately in a row direction and are almost parallel to each other. The data lines D1-Dm and the bias lines B1-Bm extend approximately in a column direction and are almost parallel to each other.

The gate driver 40 is connected to the gate lines G1-Gn of the X-ray detection panel 30. Further, the gate driver 40 supplies the gate signal to the gate of the thin film transistor included in the detection unit element 31. The gate signal functions to control the turn-on or turn-off of the thin film transistor, and it is transmitted through the gate lines G1-Gn. The gate signal can include a gate-on voltage (Von) signal to turn on the thin film transistor and a gate-off voltage (Voff) signal to turn off the thin film transistor. The gate driver 40 sequentially applies the gate-on voltage (Von) signals to the plurality of respective gate lines G1-Gn and, when the gate-on voltages (Von) signals are not supplied, supplies the gate-off voltage (Voff) signals to the respective gate lines G1-Gn.

The reception signal detector 50 is connected to the data lines D1-Dm of the X-ray detection panel 30, and is configured to receive signals detected by the respective PIN diodes. The reception signal detector 50 includes a capacitor (not shown) connected to an OP AMP (not shown), and is configured to gather the signals detected by the PIN diodes during the gate-on time. The OP AMP here refers to an operational amplifier. The capacitor sends the gathered signals to a shift register (not shown). The shift register stores the signals during at least one gate-on time and sends them to an AD converter (not shown). The AD converter here refers to an analog and digital signal converter. The signals sent to the A/D converter (not shown) are converted into digital signals and then outputted. The outputted digital signals cause display in the form of a digital image.

The bias power supply unit 60 is connected to the bias lines B1-Bm of the X-ray detection panel 30, and is configured to supply the bias voltages to the respective PIN diodes. The PIN diode to which the bias voltage is supplied can detect a visible ray corresponding to an irradiated X-ray (i.e., converted by a scintillator), and generates electrical current corresponding to the detected visible ray. If the bias voltage is not supplied to the PIN diode, the PIN diode does not generate current even though a visible ray is incident thereon, and so does not function as the photosensor.

The gate driver 40, the reception signal detector 50, and the bias power supply unit 60 can be integrated on the X-ray detection panel 30 in the form of at least one integrated circuit chip.

In one embodiment, the gate driver 40, the reception signal detector 50, and the bias power supply unit 60 may be mounted on a flexible printed circuit film (not shown) and then attached to the X-ray detection panel 30 in the form of a tape carrier package (TCP), or may be mounted on an additional flexible printed circuit (FPC) (not shown).

In another embodiment, the gate driver 40, the reception signal detector 50, and the bias power supply unit 60 may be integrated on the X-ray detection panel 30 along with the signal lines G1-Gn, D1-Dm, and B1-Bm and a thin film transistor Q.

In yet another embodiment, the gate driver 40, the reception signal detector 50, and the bias power supply unit 60 may be integrated into a single chip. In this case, at least one of them or at least one circuit element constituting them may be external to the single chip.

Figure 2:
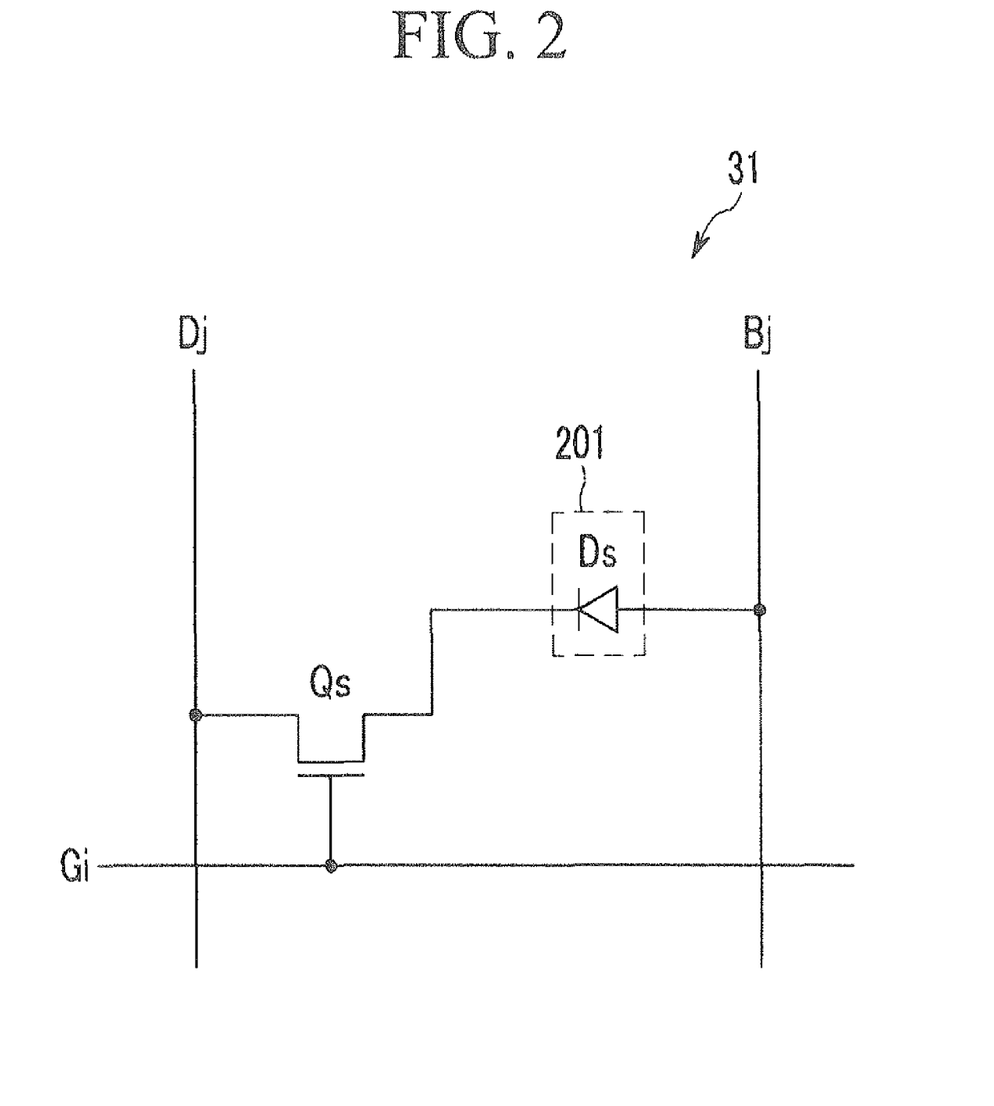
FIG. 2 is a diagram showing an equivalent circuit of a detection unit element 31 shown in FIG. 1.

FIG. 2 is a diagram showing an equivalent circuit of the detection unit element 31 shown in FIG. 1.

Referring to FIG. 2, the detection unit element 31 includes one thin film transistor Qs and one photosensor 201. FIG. 2 shows an example in which a PIN diode Ds is used as the photosensor 201.

The PIN diode Ds plays the role of a photosensor for detecting light. A scintillator (refer to 230 of FIG. 5 to be described later) is placed on the upper portion of the thin film transistor Qs and the PIN diode Ds. The scintillator 230 may cover the entireties of the thin film transistor Qs and the PIN diode Ds. The scintillator 230 is made of material that emits light when radiation collides against it. The scintillator 230 functions to convert an incident X-ray into light of a visible ray region and to output the visible ray. The emitted visible ray is detected by the PIN diode Ds (i.e., the photosensor).

The thin film transistor Qs transfers an optical signal, detected by the PIN diode Ds, to the reception signal detector 50 via the data line Dj in response to the gate signal Gi.

Figure 3:
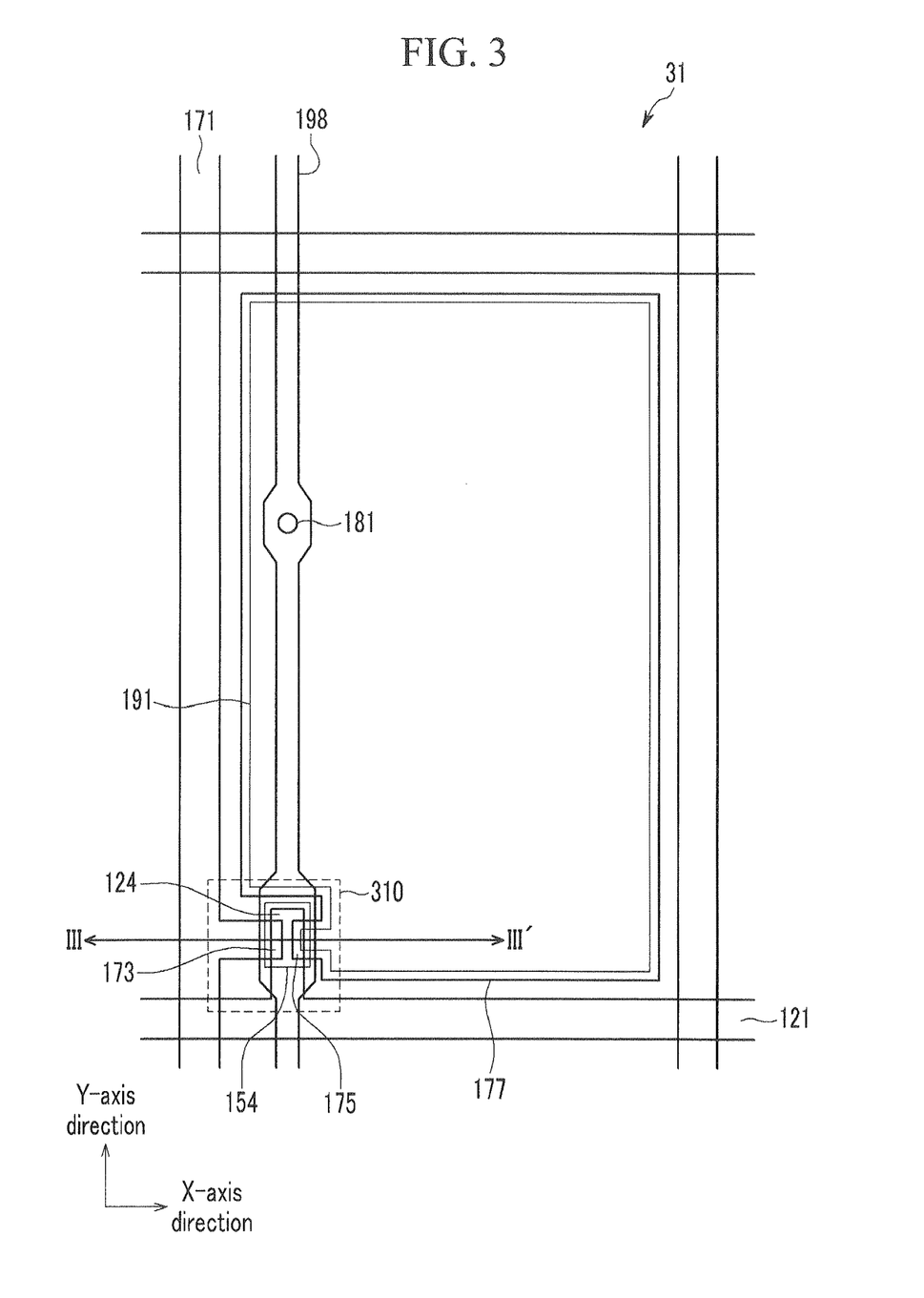
FIG. 3 is a layout diagram and a plan view showing the arrangement of the detection unit element 31 shown in FIG. 2.

FIG. 3 is a diagram showing the arrangement of the detection unit element 31 shown in FIG. 2.

Referring to FIG. 3, one detection unit element 31 included in the X-ray detector according to the exemplary embodiment of the present invention is connected to a data line Dj 171, a bias line Bj 198, and a gate line Gi 121.

The data line 171 transfers the data signal Dj and extends in one direction (hereinafter referred to as an Y-axis direction).

The bias line 198 transfers the bias voltage Bj and extends in the Y-axis direction. A contact hole 181 is formed in the bias line 198, and the bias line 198 and the PIN diode Ds are connected to each other through the contact hole 181.

Further, the gate line 121 transfers the gate signal Gi and extends in a direction perpendicular to the data line 171 or the bias line 198 (hereinafter referred to as an X-axis direction). The gate line 121 comes in contact with a gate electrode 124 through a contact hole (not shown).

The arrangement and the cross-section of a region 310 shown in FIG. 3 are described in detail with reference to FIGS. 4 to 7.

Figure 4:
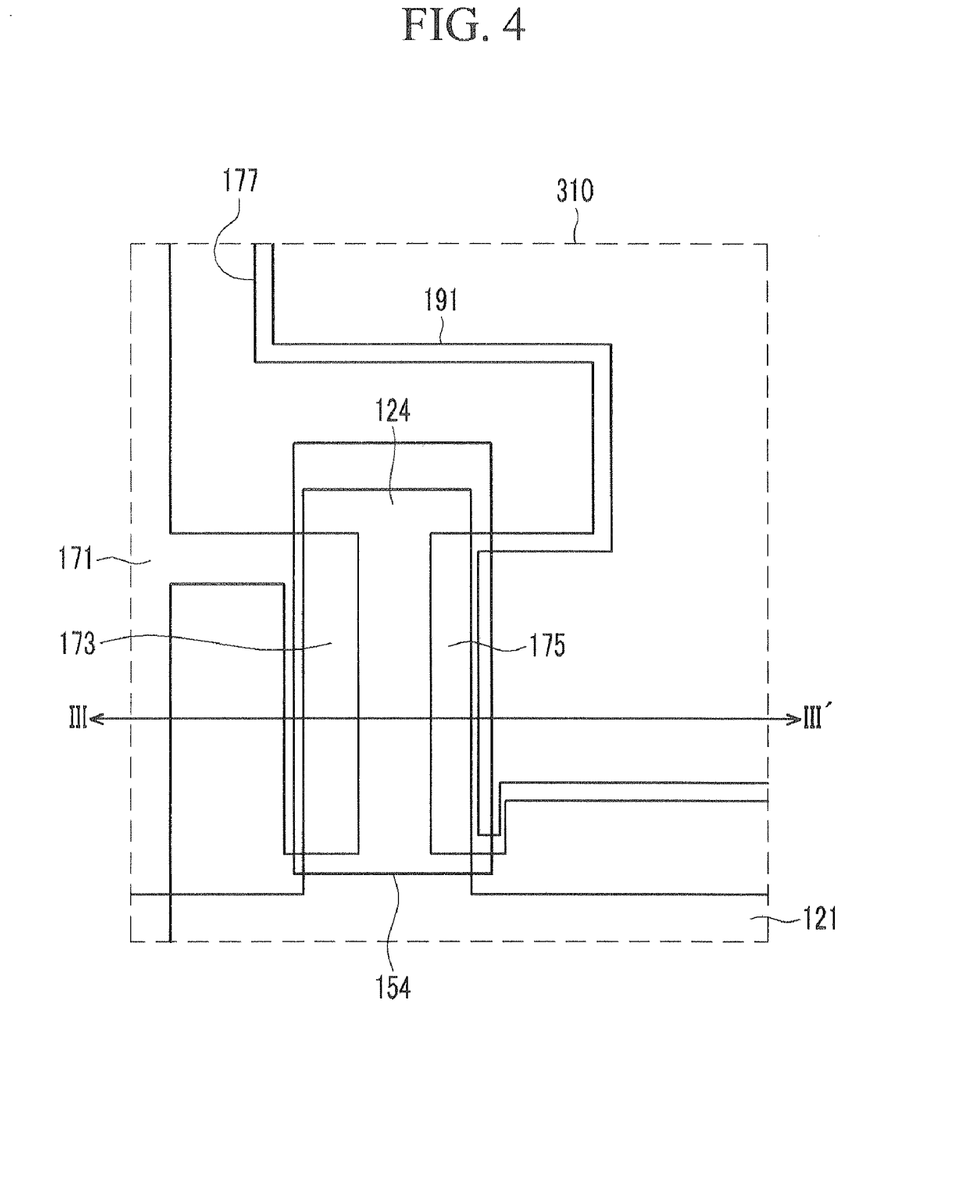
FIG. 4 is a detailed layout diagram and a plan view showing the arrangement of a region 310 shown in FIG. 3 in accordance with an exemplary embodiment of the present invention.

FIG. 4 is a detailed diagram showing the arrangement of the region 310 shown in FIG. 3 in accordance with an exemplary embodiment of the present invention.

Figure 5:
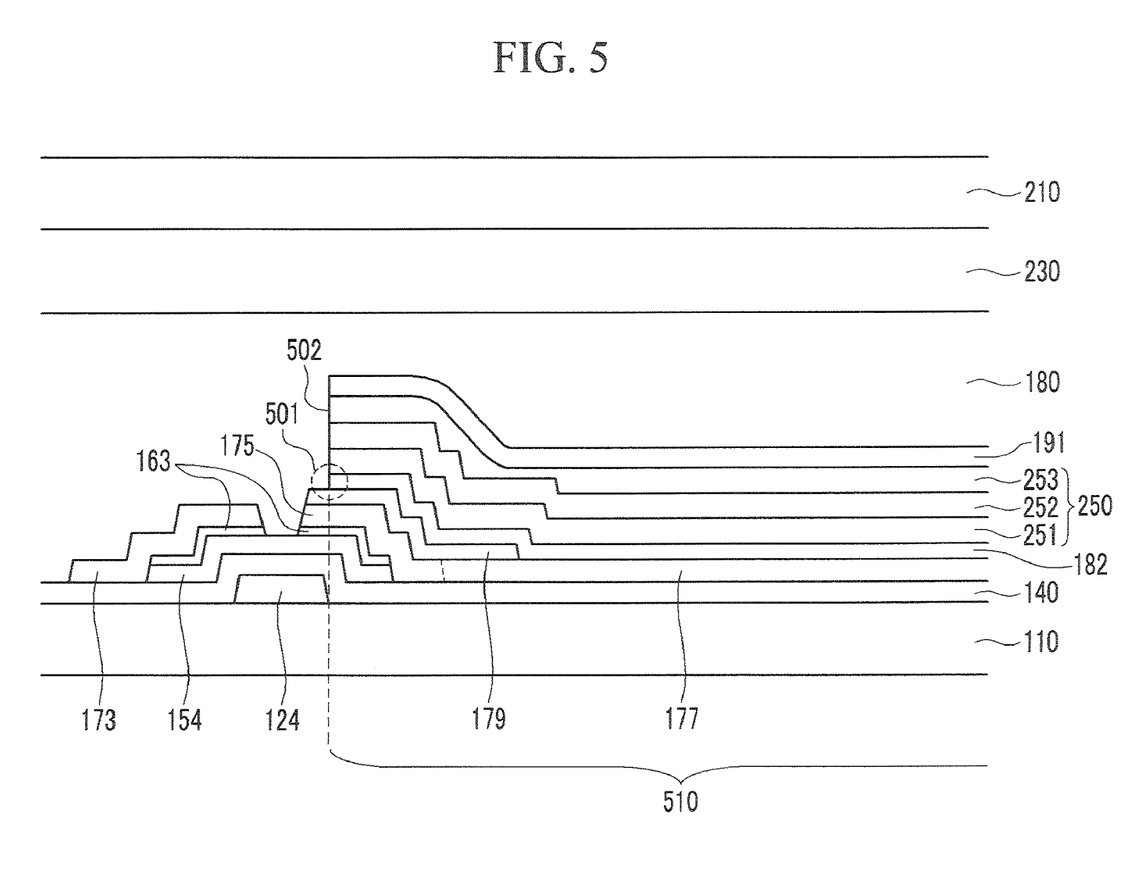
FIG. 5 is a cross-sectional view of the region taken along line of FIG. 4.

FIG. 5 is a cross-sectional view of the region 310 taken along line III-III' of FIG. 4.

Referring to FIGS. 4 and 5, the gate line 121 is formed on the upper portion of a lower substrate 110 made of transparent glass or plastic. The gate line 121 is connected to the gate electrode 124.

A gate insulating layer 140 is formed on the upper portion of the gate line 121 and the gate electrode 124. The gate insulating layer 140 is made of an insulating material, such as silicon nitride (SiNx) or oxide nitride (SiOx).

The gate insulating layer 140 is made of a material such as silicon nitride (SiNx) or oxide nitride (SiOx) on the gate line 121.

A semiconductor layer 154 is made of material such as hydrogenated amorphous silicon or polysilicon and is formed on the gate insulating layer 140. The semiconductor layer 154 is formed over the gate electrode 124 and on some regions of the gate insulating layer 140, such as that shown in FIGS. 4 and 5. The semiconductor layer 154 may be preferably formed to have a size that may cover both ends of the gate electrode 124.

An ohmic contact 163 is formed on the semiconductor layer 154. The ohmic contact 163 may be made of a material such as n+hydrogenated amorphous silicon in which an n-type impurity, such as phosphorous (P), is doped at a high concentration, or may be made of silicide. The ohmic contact 163 exists between the semiconductor layer 154 and a drain electrode 175 and functions to lower electrical contact resistance therebetween.

A source electrode 173 is formed on the ohmic contact 163 and the gate insulating layer 140 that are formed on the left side of FIG. 5. The source electrode 173 is connected to the data line 171.

The drain electrode 175 is separated from the data line Dj 171 and is disposed on the opposite side to the source electrode 173 about the center of the gate electrode 124. The drain electrode 175 may be formed on the upper portion of the ohmic contact 163 and the gate insulating layer 140 that are formed on the right side of the gate electrode 124 as shown in FIG. 5.

Furthermore, a first lower electrode 177 is configured to include the drain electrode 175 and extends from the drain electrode 175. The first lower electrode 177 including the drain electrode 175 is formed on some regions of the semiconductor layer 154 forming the thin film transistor Qs and a region 510 in which the PIN diode is disposed. In other words, the drain electrode 175 is elongated to thereby form the first lower electrode 177 of the PIN diode Ds.

A passivation layer 179 is formed on the upper portion of one part of the first lower electrode 177 including the drain electrode 175. That is, as shown in FIG. 5, the passivation layer 179 is formed to cover a portion of the first lower electrode 177, including the drain electrode 175. The passivation layer 179 may be formed on an upper portion of the second lower electrode 182 so that the passivation layer is stacked approaching the gate electrode.

A second lower electrode 182 is formed on the upper portion of the passivation layer 179 and the first lower electrode 177 in which the passivation layer 179 is not formed. The second lower electrode 182 may be disposed to cover only partial of the passivation layer 179, and the passivation layer 179 may completely cover the drain electrode 175. In other words, the whole source electrode 173 and a portion of the drain electrode 175 may be exposed by the second lower electrode 182. The boundary region 501 refers to the adjacent region between the PIN diode Ds and the TFT Qs, and the extension of the boundary 502 of the PIN diode Ds may be in immediate contact with or separate from the gate electrode 124. In this embodiment, in a plan view of the X-ray detector, the gate electrode 124 does not overlap with the second lower electrode 182, with the semiconductor layer 250 for a diode, and with the upper electrode 191.

Both the first lower electrode 177 and the second lower electrode 182 form the lower electrode (precisely, the cathode) of the PIN diode Ds.

One gate electrode 124, one source electrode 173, and one drain electrode 175, together with the semiconductor layer 154, form one thin film transistor (TFT) Qs. The channel of the thin film transistor is formed in the semiconductor layer 154 between the source electrode 173 and the drain electrode 175.

A semiconductor layer 250 for a diode is formed on the upper portion of the second lower electrode 182 of the PIN diode. The semiconductor layer 250 for a diode has a structure in which an n-type semiconductor 251, an intrinsic semiconductor 252, and a p-type semiconductor 253 are sequentially stacked.

An upper electrode 191 of the PIN diode Ds is formed on the upper portion of the semiconductor layer 250 for a diode, and is made of a transparent conducting material such as ITO or IZO. The upper electrode 191 is formed in a region corresponding to the first and second lower electrodes 177 and 182 and the semiconductor layer 250 for a diode. The upper electrode 191 may be an anode.

A protective layer 180 is formed on the drain electrode 175 connected to the data line 171, an exposed portion of the semiconductor layer 154, and the upper electrode 191 of the PIN diode. The protective layer 180 may completely cover the drain electrode 175 connected to the data line 171, the exposed portion of the passivation layer 179, the exposed portion of the semiconductor layer 154, and the upper electrode 191 of the PIN diode. The protective layer 180 may be made of an inorganic insulating material such as silicon nitride (SiNx) or oxide nitride (SiOx), or may be made of an organic insulating material. The protective layer 180 may have a structure including two layers in each of which the inorganic insulating material or the organic insulating material is stacked. The contact hole 181 exposing the upper electrode 191 is formed on the protective layer 180. The bias line (refer to 198 of FIG. 3) is further formed on the upper portion of the protective layer 180.

The scintillator 230 is formed on the upper portion of the protective layer 180. The scintillator 230 is made of material that emits light when it is collided against by radiation. The scintillator 230 functions to convert an incident X-ray into light of a visible ray region (particularly, a green wavelength) and to output the visible ray. The emitted light is incident on the PIN diode Ds, thus generating an electrical current.

An upper substrate 210 is formed on the upper portion of the scintillator 230. The upper substrate 210 functions to protect the underlying structures of the scintillator 230.

In the contemporary X-ray detector structure, an electron trap phenomenon is generated in the boundary region (e.g., refer to 501 of FIG. 5) of the PIN diode. Accordingly, noise is generated, and so the photodetection efficiency of the PIN diode is deteriorated. Consequently, the DQE is reduced.

The X-ray detector constructed as the exemplary embodiment of the present invention, as described above, may eliminate the occurrence of the electron trap phenomenon because it includes the passivation layer 179. Accordingly, the photodetection efficiency of the PIN diode may be increased, and the DQE of the X-ray detector may also be increased.

Further, in the X-ray detector constructed as the exemplary embodiment of the present invention, the second lower electrode 182 is formed approaching the gate electrode 124. The gate electrode 124 and the second lower electrode 182 have a shape such that they do not overlap with each other, and maximize an area where the PIN diode is disposed within the X-ray detector. Accordingly, a high fill factor can be realized. With an increase of the fill factor, the photodetection efficiency of the PIN diode is increased, and so the DQE of the X-ray detector can be increased.

An X-ray detector according to another exemplary embodiment of the present invention has a different structure to the X-ray detector according to the above-described exemplary embodiment, and has the gate electrode and the second lower electrode partially overlapping with each other.

Figure 6:
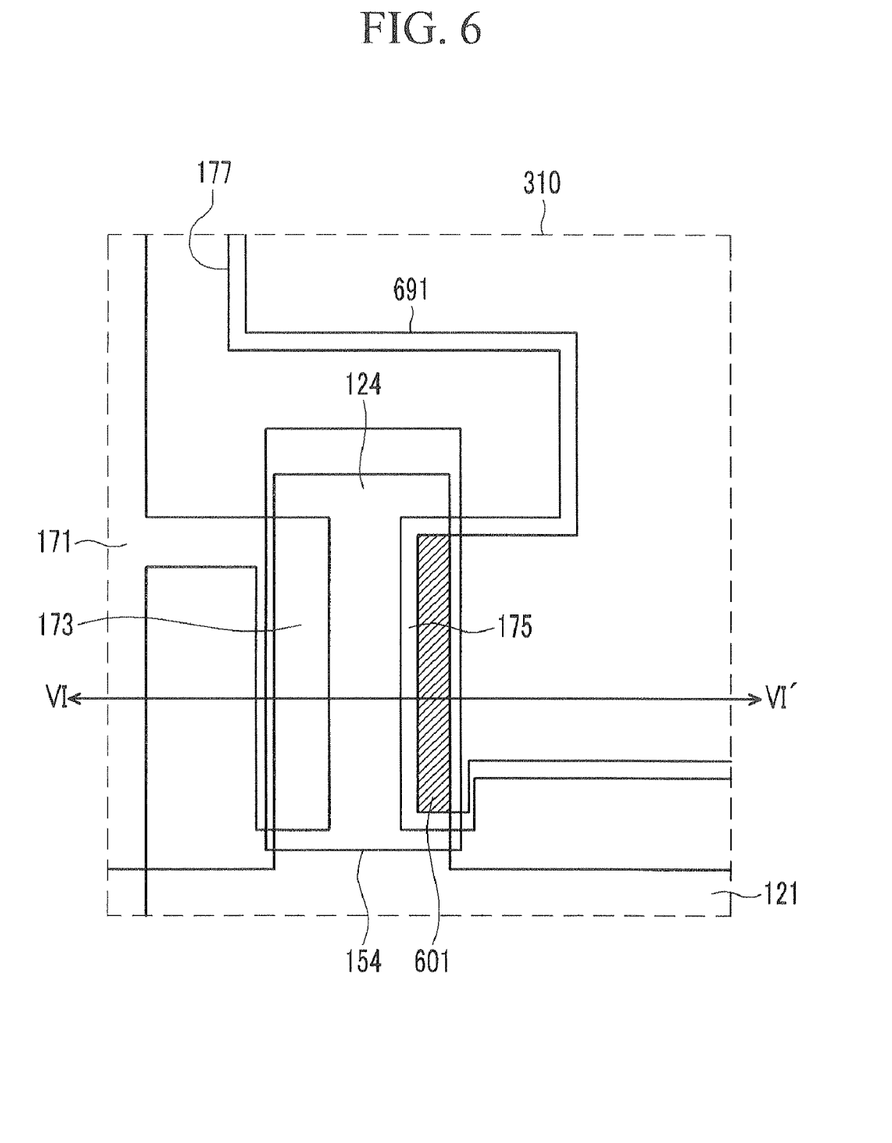
FIG. 6 is a detailed layout diagram and a plan view showing the arrangement of the region 310 of FIG. 3 in accordance with another exemplary embodiment of the present invention.

FIG. 6 is a detailed diagram showing the arrangement of the region 310 of FIG. 3 in accordance with another exemplary embodiment of the present invention.

Figure 7:
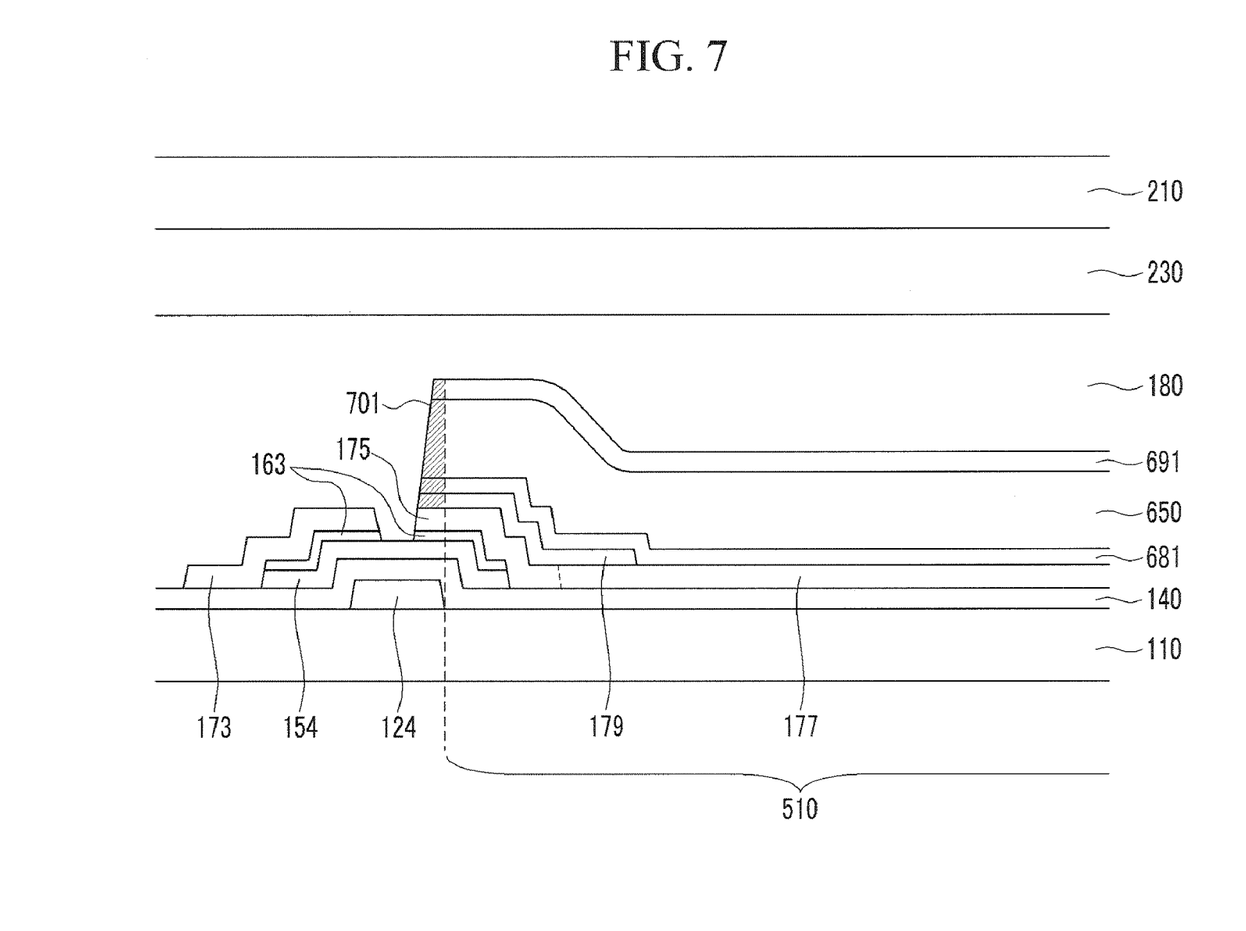
FIG. 7 is a cross-sectional view of the region taken along line VI-VI' of FIG. 6.

FIG. 7 is a cross-sectional view of the region taken along line VI-VI' of FIG. 6.

Referring to FIG. 6, a second lower electrode 681, a semiconductor layer 650 for a diode, and an upper electrode 691 are expanded as much as a region 601 as compared with FIG. 4.

Referring to FIG. 7, the second lower electrode 681, the semiconductor layer 650 for a diode, and the upper electrode 691 are expanded as much as an oblique line 701 as compared with FIG. 5.

In other words, in a plan view of the X-ray detector, a gate electrode 124 may overlap with the second lower electrode 681, the semiconductor layer 650 for a diode, and the upper electrode 691. The shadowed portion of FIGS. 6 and 7 refer to the overlapped portions between the gate electrode 124 and the second lower electrode 681, the semiconductor layer 650 for a diode, and the upper electrode 691.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An X-ray detector, comprising:
   a first substrate;
   agate electrode formed on the first substrate;
   agate insulating layer formed on the gate electrode and the first substrate, and formed to cover the gate electrode;
   a first semiconductor layer of a thin film transistor stacked on one part of the gate insulating layer;
   a data line configured to include a source electrode to cover a first portion of the first semiconductor layer;
   a first lower electrode configured to include a drain electrode opposite to the source electrode, formed on the upper portion of the gate insulating layer and a second portion of the first semiconductor layer, and extending from the drain electrode;
   a passivation layer formed on an upper portion of one part of the first lower electrode;
   a second lower electrode formed on an upper portion of the passivation layer and on an upper portion of the first lower electrode on which the passivation layer is not formed;
   a second semiconductor layer of a diode formed on an upper portion of the second lower electrode; and
   an upper electrode formed on an upper portion of the second semiconductor layer of the diode,
   wherein the second lower electrode is formed approaching the gate electrode and is formed not to overlap with the gate electrode.

2. The X-ray detector of claim 1, wherein the passivation layer is
   formed on an upper portion of the drain electrode and one part of the first lower electrode extending from and connected to the drain electrode.

3. The X-ray detector of claim 1, wherein the passivation layer is
 formed on an upper portion of the second lower electrode so that the passivation layer is stacked approaching the gate electrode.

4. The X-ray detector of claim 1, further comprising
 a protective layer formed on an upper portion of the upper electrode.

5. The X-ray detector of claim 4, further comprising
 a scintillator layer for converting an externally incident X-ray into a visible ray.

6. An X-ray detector, comprising:
 a first substrate;
 a gate electrode formed on the substrate;
 a gate insulating layer formed on the gate electrode and the first substrate and formed to cover the gate electrode;
 a first semiconductor layer of a thin film transistor stacked on one part of the gate insulating layer;
 a data line configured to include a source electrode to cover a first portion of the first semiconductor layer;
 a first lower electrode configured to include a drain electrode opposite to the source electrode, formed on an upper portion of the gate insulating layer and a second portion of the first semiconductor layer, and extending from the drain electrode;
 a passivation layer formed on an upper portion of one part of the first lower electrode;
 a second lower electrode formed on an upper portion of the passivation layer and on an upper portion of the first lower electrode in which the passivation layer is not formed;
 a second semiconductor layer of a diode formed on an upper portion of the second lower electrode; and
 an upper electrode formed on an upper portion of the second semiconductor layer of the diode,
 wherein the second lower electrode overlaps with the gate electrode.

7. The X-ray detector of claim 6, wherein the first lower electrode and the second semiconductor layer for the diode overlap with the gate electrode.

8. The X-ray detector of claim 6, wherein the passivation layer is
 formed on an upper portion of the drain electrode and one part of the first lower electrode extending from and connected to the drain electrode.

9. The X-ray detector of claim 6, wherein the passivation layer is
 formed on an upper portion of the second lower electrode so that the passivation layer is overlapped with the gate electrode and stacked on the gate electrode.

10. The X-ray detector of claim 6, further comprising
 a protective layer formed on an upper portion of the upper electrode.

11. The X-ray detector of claim 6, further comprising
 a scintillator layer for converting an externally incident X-ray into a visible ray.

12. An X-ray detector, comprising:
 a substrate based on which a thin film transistor and a PIN diode are formed;
 the thin film transistor comprised of:
  a gate electrode,
  a gate insulating layer formed to cover the gate electrode,
  a first semiconductor layer stacked on the gate insulating layer,
  a source electrode disposed to cover a first portion of the first semiconductor layer where a data line is physically connected to the source electrode, and
  a drain electrode disposed to cover a second portion of the first semiconductor layer; and
 the PIN diode comprised of:
  a first lower electrode extending from the drain electrode and the first lower electrode formed to cover the gate insulating layer,
  a passivation layer formed on the first lower electrode to cover an entirety of the drain electrode,
  a second lower electrode formed on the passivation layer,
  a second semiconductor layer formed to completely cover the second lower electrode, and
  an upper electrode formed to cover the second semiconductor layer.

13. The X-ray detector of claim 12, further comprising a protective layer formed on the upper electrode.

14. The X-ray detector of claim 12, further comprising a scintillator layer for converting an externally incident X-ray into a visible ray, and the scintillator layer completely covering the thin film transistor and the PIN diode.

15. The X-ray detector of claim 12, wherein the second lower electrode is formed to expose a portion of the passivation layer.

16. The X-ray detector of claim 12, wherein the second lower electrode is formed to cover an entirety of the passivation layer.

17. The X-ray detector of claim 12, wherein the second lower electrode does not overlap with the gate electrode in a plan view of the X-ray detector.

18. The X-ray detector of claim 12, wherein the second lower electrode overlaps with the gate electrode in a plan view of the X-ray detector.

* * * * *